(12) United States Patent
Motowaki

(10) Patent No.: US 10,455,749 B2
(45) Date of Patent: Oct. 22, 2019

(54) PARTS SUPPLY DEVICE AND PARTS SUPPLY ROBOT HAVING THE SAME

(71) Applicant: FANUC CORPORATION, Yamanashi (JP)

(72) Inventor: Yoshio Motowaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/867,383

(22) Filed: Jan. 10, 2018

(65) Prior Publication Data

US 2018/0228066 A1   Aug. 9, 2018

(30) Foreign Application Priority Data

Feb. 3, 2017 (JP) .................................. 2017-018531

(51) Int. Cl.
| | |
|---|---|
| *H05K 13/02* | (2006.01) |
| *B65G 59/06* | (2006.01) |
| *B25J 15/00* | (2006.01) |
| *B25J 11/00* | (2006.01) |
| *B23P 19/00* | (2006.01) |
| *H05K 13/04* | (2006.01) |

(52) U.S. Cl.
CPC ............ *H05K 13/02* (2013.01); *B23P 19/001* (2013.01); *B25J 11/005* (2013.01);
(Continued)

(58) Field of Classification Search
CPC ...... H05K 13/02; H05K 13/022; H05K 13/04; H05K 13/0215; H05K 13/0434;
(Continued)

(56) References Cited

U.S. PATENT DOCUMENTS

| | | | | |
|---|---|---|---|---|
| 4,202,092 A | * | 5/1980 | Shibasaki | .......... H05K 13/0495 198/345.1 |
| 4,733,459 A | * | 3/1988 | Tateno | ............... B65G 47/8884 198/463.6 |

(Continued)

FOREIGN PATENT DOCUMENTS

| | | |
|---|---|---|
| CN | 1196872 A | 10/1998 |
| CN | 201604152 U | 10/2010 |

(Continued)

OTHER PUBLICATIONS

Chinese Office Action dated Feb. 2, 2019, for Chinese Patent Application No. 201810098245.0.

*Primary Examiner* — Lynn E Schwenning
(74) *Attorney, Agent, or Firm* — Karceski IP Law, PLLC

(57) ABSTRACT

A parts supply device includes a robot attachment member to be attached to a distal end portion of a robot arm, a parts holding tool supported by the robot attachment member, a stick mounting unit supported by the robot attachment member and on which a stick containing parts is mounted, a parts discharging mechanism which discharges, one by one, the parts contained in the stick mounted on the stick mounting unit, a guide member that guides the parts discharged by the parts discharging mechanism to a holding position by a holding member of the parts holding tool, and a relative movement device that moves the guide member in a state where one of the parts is held by the holding member to allow the one of the parts held by the holding member to be mounted on a predetermined position.

9 Claims, 11 Drawing Sheets

(52) U.S. Cl.
CPC ........ *B25J 15/0019* (2013.01); *B65G 59/061* (2013.01); *H05K 13/022* (2013.01); *B65G 59/062* (2013.01); *H05K 13/04* (2013.01); *Y10S 901/41* (2013.01)

(58) Field of Classification Search
CPC ........ B23P 19/001; B21J 15/00; B25J 11/005; B25J 15/0019; B65G 59/061; B65G 47/5104; Y10S 901/41
USPC .......... 414/789.1; 248/205.5, 205.8; 221/132
See application file for complete search history.

(56) References Cited

U.S. PATENT DOCUMENTS

| | | | | |
|---|---|---|---|---|
| 4,761,106 A | * | 8/1988 | Brown | B65G 59/067 414/797.4 |
| 5,210,933 A | * | 5/1993 | Miyanishi | H05K 13/0404 29/741 |
| 6,132,167 A | * | 10/2000 | Ikeya | H05K 13/02 29/809 |
| 2017/0020038 A1 | * | 1/2017 | Eguchi | H05K 13/021 |

FOREIGN PATENT DOCUMENTS

| | | |
|---|---|---|
| EP | 852458 A1 | 7/1998 |
| EP | 2657157 A1 | 10/2013 |
| GB | 2250458 A | 6/1992 |
| JP | S5990591 U | 6/1984 |
| JP | S60125000 A | 7/1985 |
| JP | H0543597 U | 6/1993 |
| JP | H06166434 | 6/1994 |
| JP | H10013089 | 1/1998 |
| JP | 2001111295 | 4/2001 |
| JP | 2009295946 A | 12/2009 |
| JP | 2012136304 | 7/2012 |

* cited by examiner

PARTS SUPPLY DEVICE AND PARTS SUPPLY ROBOT HAVING THE SAME

CROSS-REFERENCE TO RELATED APPLICATIONS

This application is based on and claims priority to Japanese Patent Application No. 2017-018531, filed on Feb. 3, 2017, the entire content of which is incorporated herein by reference.

FIELD OF THE INVENTION

The present invention relates to a parts supply device and a parts supply robot having the same.

BACKGROUND OF THE INVENTION

Conventionally, a parts supply device has been known (for example, see Japanese Unexamined Patent Application, Publication No. 2012-136304). In such a parts supply device, a plurality of tubular sticks, each containing parts aligned in a line, are stacked to be a multi-story state, and the parts in the stick arranged at the bottom are pushed out toward a parts supply path by a parts pushout mechanism. When there are no parts in the stick arranged at the bottom, the multi-story stacked sticks are moved downward by a distance equal to one stick, and the parts contained in the second stick from the bottom are pushed out by the parts pushout mechanism.

SUMMARY OF THE INVENTION

A parts supply device according to a first aspect of the present invention includes a robot attachment member configured to be attached to a distal end portion of a robot arm; a parts holding tool supported by the robot attachment member and having a holding member for holding parts; a stick mounting unit which is supported by the robot attachment member and on which at least one tubular stick containing the parts aligned in a direction is mountable; a parts discharging mechanism which discharges, one by one, the parts contained in the stick mounted on the stick mounting unit; a guide member that guides the parts discharged by the parts discharging mechanism to a holding position at which one of the parts can be held by the holding member; and a relative movement device which moves at least one of the guide member and the holding member in a state in which the one of the parts guided to the holding position is held by the holding member in order to allow the one of the parts held by the holding member to be in a state in which the one of the parts can be mounted on or supplied to a predetermined position.

A parts supply robot, according to a second aspect of the present invention, includes a robot arm, and the parts supply device attached to a distal end portion of the robot arm.

DESCRIPTION OF EMBODIMENTS OF THE INVENTION

A parts supply device 1 and a parts supply robot 100 having the parts supply device 1 according to an embodiment of the present invention will be described with reference to the drawings.

Figure 1:
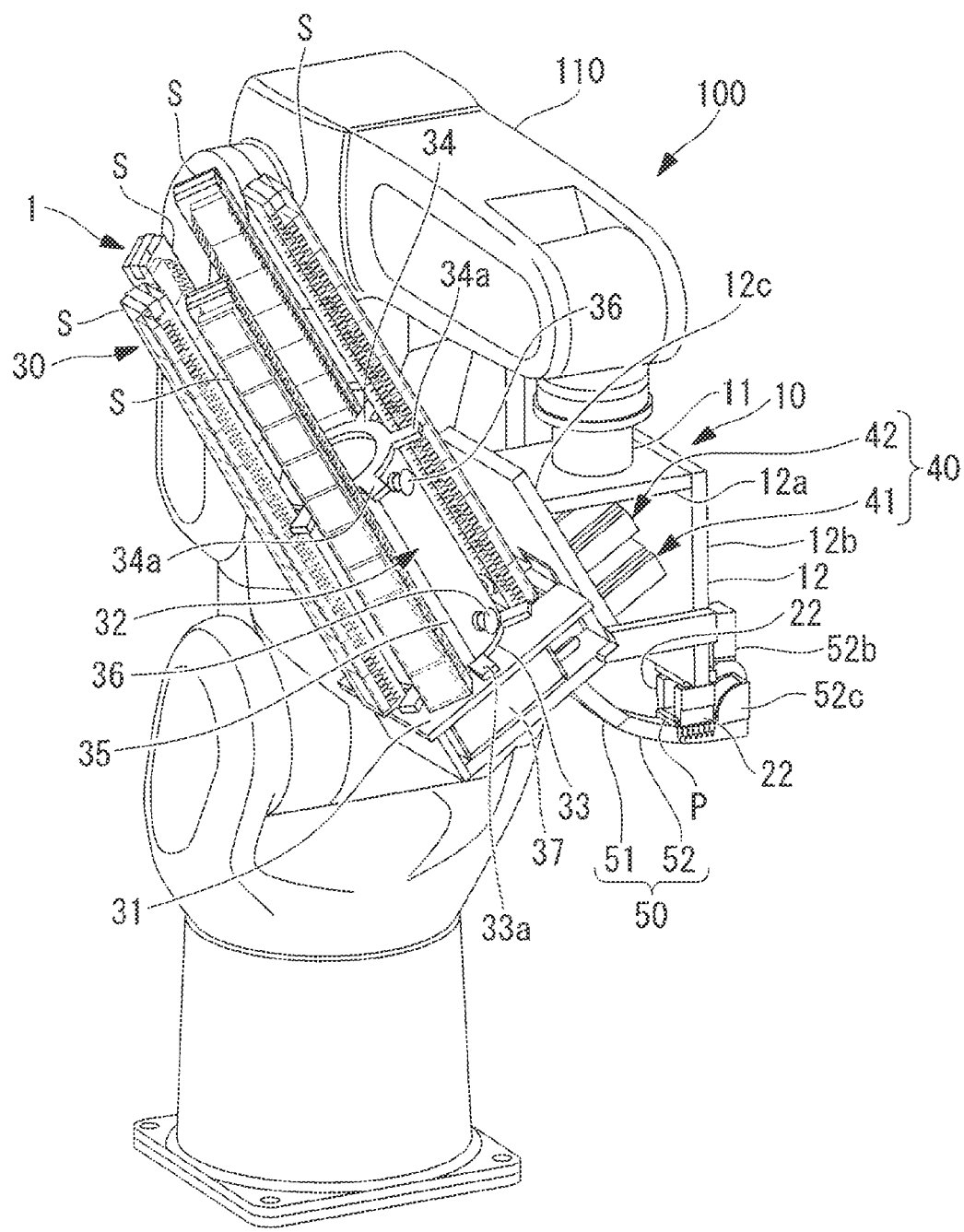
FIG. 1 is a schematic configuration diagram of a parts supply device and a parts supply robot having the same according to an embodiment of the present invention.
Figure 2:
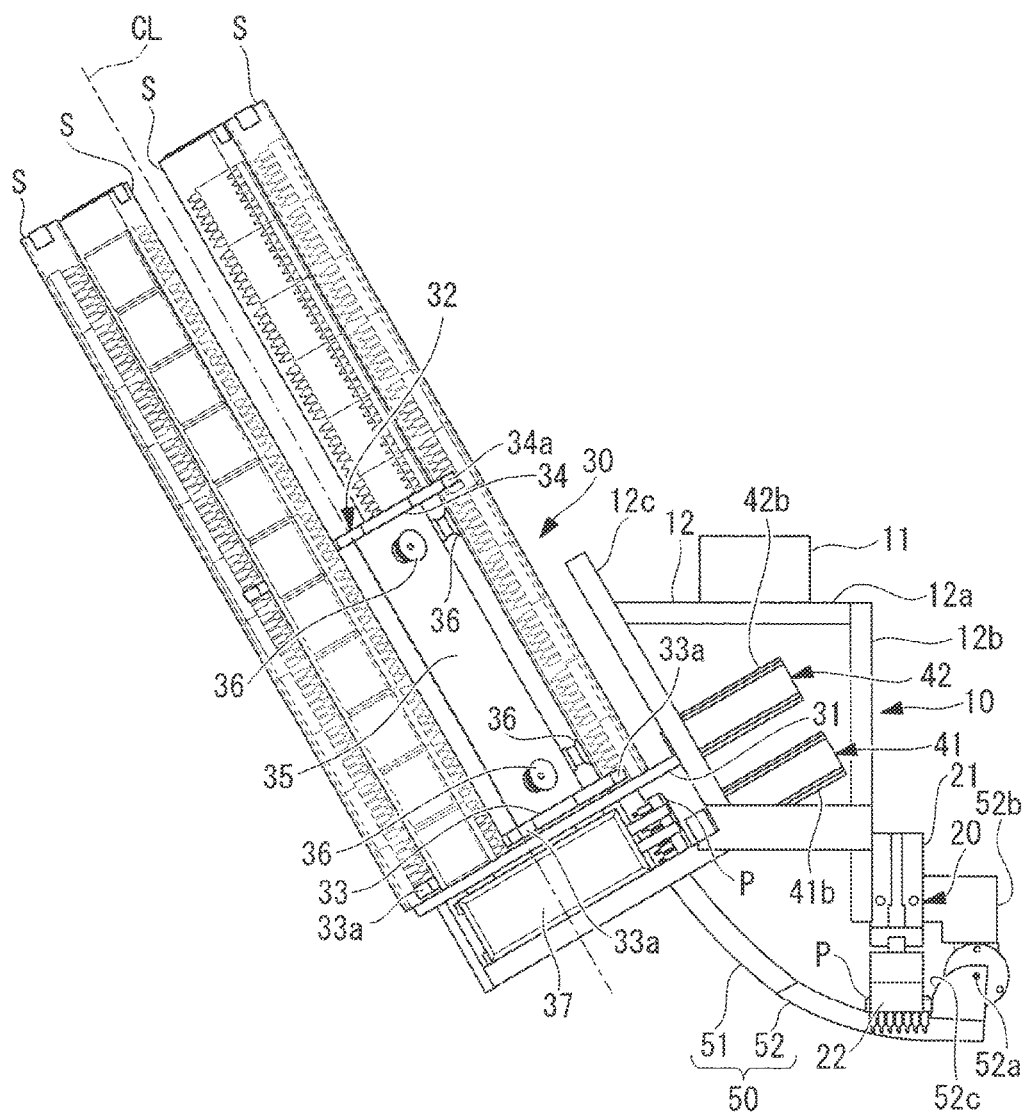
FIG. 2 is a front view of the parts supply device of the present embodiment.
Figure 3:
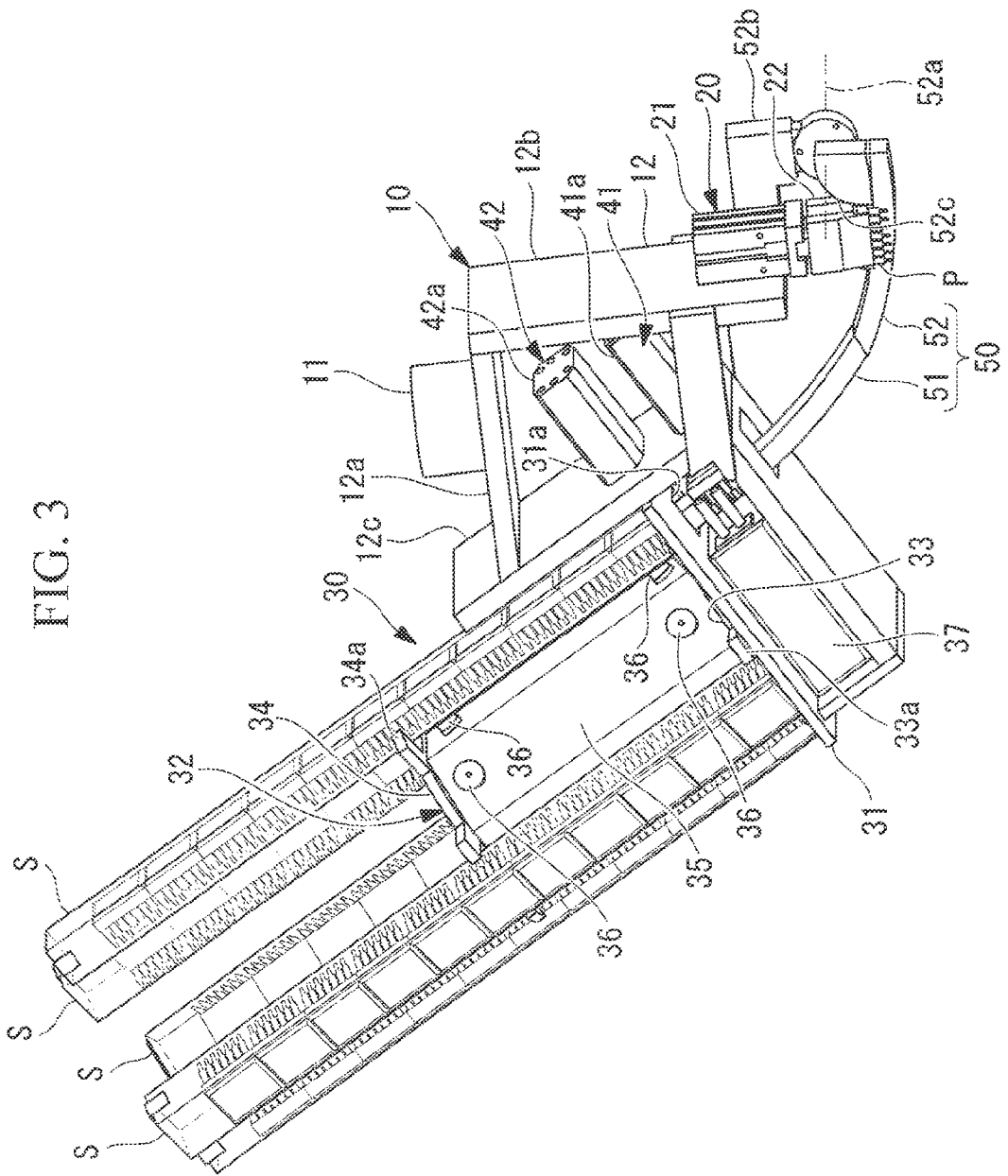
FIG. 3 is a perspective view of the parts supply device of the present embodiment.

As illustrated in FIGS. 1 to 3, the parts supply device 1 includes a robot attachment member 10 attached to a distal end portion of a robot arm 110, a parts holding tool 20 for holding each of the parts P, a stick mounting unit 30 on which a plurality of tubular sticks S, each containing the parts P aligned in a line, are mounted, a parts discharging mechanism 40 for discharging, one by one, the parts P in the stick S located at a predetermined rotation position among the sticks S mounted on the stick mounting unit 30, and a guide member 50 for guiding the parts P discharged by the parts discharging mechanism 40.

The stick S used in the present embodiment is made of a translucent plastic material, and the stick S is a tubular member having a rectangular cross section. One end in the longitudinal direction of the stick S is opened, and the other end may be opened or closed. In the present embodiment, the other end is closed with a metallic removable clip. The hollow part of the stick S may have a shape and dimensions that allow the parts P contained therein to be movable in the longitudinal direction of the stick S and that prevent the parts P contained therein from being rotated in the stick S. In the present embodiment, the parts P are IC parts in each of which a plurality of terminals extend from the main body part in a predetermined direction.

The robot attachment member 10 includes a cylindrical connecting part 11 connected to the distal end portion of the robot arm 110, and a frame 12 fixed to the connecting part 11. The frame 12 includes a base member 12a extending in a direction perpendicular to the axis of the connecting part 11, a one-end side member 12b extending downward from one end of the base member 12a and along the axis of the connecting part 11, and the other-end side member 12c obliquely extending downward from the other end of the base member 12a so as to approach the one-end side member 12b.

In the present embodiment, the parts holding tool 20 includes an actuator 21 fixed to the one-end side member 12b, and a pair of claw members (holding members) 22 movable in a closing direction (direction of approaching each other) and an opening direction (direction of separating from each other) by the actuator 21. When the pair of claw members 22 is moved by the actuator 21, each of the parts P is held between the pair of claw members 22.

In the present embodiment, the actuator 21 is connected to a compressor, and the actuator 21 moves the pair of claw members 22 by the compressed air from the compressor. However, the actuator 21 may be one using an electric motor. The actuator 21 is controlled by a control unit 120 described below (see FIG. 4).

The stick mounting unit 30 includes a plate-like table member 31 extending in a direction perpendicular to the other-end side member 12c, a rotor 32 supported by the table member 31 in a manner rotatable about a rotation axis CL perpendicular to one surface in the thickness direction (in the present embodiment, the upper surface in FIG. 2) of the table member 31, and a motor 37 that is a driving device for rotating the rotor 32. The motor 37 is fixed to the other-end side member 12c, and the output shaft of the motor 37 is connected to the rotor 32 via reduction gears or the like.

The motor 37 includes therein an operating position detection device such as an encoder that detects the operating position of the motor 37. Detection values of the operating position detection device are transmitted to the control unit 120 described below, and the detection values are used for control of the motor 37 by the control unit 120.

The rotor 32 includes a pair of guide plates 33 and 34 arranged with a space between them in a direction along the rotation axis CL, and a cylindrical portion 35 connecting the guide plate 33 and the guide plate 34.

The stick mounting unit 30 of the present embodiment is configured such that six sticks S are mountable. The outer circumferential face of the cylindrical portion 35 has six plane portions according to the number of sticks to be mounted. On the outer circumferential face of the cylindrical portion 35, a plurality of vacuum members 36 are provided in such a manner that two vacuum members 36 are provided to each of the plane portions. The two vacuum members 36 are arranged with a space between them in a direction along the rotation axis CL.

One stick S is sucked by the two vacuum members 36 on each plane portion. Thereby, the stick mounting unit 30 is able to suck six sticks S. Each vacuum member 36 is connected to a suction control unit 36a via a pipe running through the cylindrical portion 35. The suction control unit 36a is configured to be controlled by the control unit 120 described below (see FIG. 4). The suction control unit 36a may have a solenoid valve provided in each of the vacuum members 36.

The suction control unit 36a is connected to a compressor, which is not illustrated, and is able to allow each of the vacuum members 36 to be in a sucking state and a non-sucking state. The suction control unit 36a includes a pressure measuring unit 36b for suction determination to determine whether or not the stick S is sucked by each of the vacuum members 36 in the sucking state. The pressure measuring unit 36b is also connected to the control unit 120 described below. The pressure measuring unit 36b may include a pressure gauge provided in each of the vacuum members 36.

Each of the guide plates 33 and 34 has six radial protrusions 33a, 34a provided with spaces between them in the circumferential direction. By a pair of adjacent radial protrusions 33a and a pair of adjacent radial protrusions 34a, the stick S is guided to a position where it is sucked by the vacuum members 36. For example, a space on the proximal side between a pair of radial protrusions 33a and a space on the proximal side between a pair of radial protrusions 34a are the same as the width dimension of the stick S. The space between the pair of adjacent radial protrusions 33a and the space between the pair of adjacent radial protrusions 34a are gradually increased toward the radial outside.

The inside of the cylindrical portion 35 is provided with a parts presence/absence determination unit 38 that determines presence or absence of the parts inside the stick S. The parts presence/absence determination unit 38 is connected to the control unit 120 described below (see FIG. 4). For example, the parts presence/absence determination unit 38 has sensors each of which is provided to each of the six plane portions and detects presence or absence of the parts in the stick S.

One surface in the thickness direction of the table member 31 is positioned in parallel with the guide plate 33 of the rotor 32. Further, the stick S is sucked by the vacuum member 36 of the rotor 32 such that one end in the longitudinal direction of the stick S is brought into contact with or adjacent to the table member 31. This means that movement of the parts P to one end side in the longitudinal direction of the stick S is restricted by the table member 31. Meanwhile, at a position on the circular trajectory along which one end of each of the six sticks S is brought into contact when the rotor 32 is rotated by the motor 37, there is a through hole 31a penetrating the table member 31. The through hole 31a is formed such that the parts P in the stick S placed at the position passes through the through hole 31a toward the lower side by its own weight.

The parts P passing through the through hole 31a slides down along the guide member 50. Specifically, the guide member 50 has a width dimension slightly smaller than the space between one-end-side terminals and the other-end-side terminals in the width direction of each of the parts P that are IC parts. The main body of each of the parts P is brought into contact with the upper surface of the guide member 50, and the guide member 50 is positioned between the terminals of both sides in the width direction of the parts P. Thereby, each of the parts P passing through the through hole 31a slides down on the guide member 50 by its own weight.

Further, the guide member 50 includes a proximal-end-side structure member 51 and a distal-end-side structure member 52. The proximal-end-side structure member 51 is fixed to the other-end side member 12c or the table member 31, and one end thereof is positioned near the through hole 31a or inside the through hole 31a. The distal-end-side structure member 52 is attached to the one-end side member 12b so as to be tiltable about a tilt axis 52a. Further, as a relative movement device to tilt the distal-end-side structure member 52, an actuator 52b is also provided.

In the present embodiment, the actuator 52b is connected to a compressor, and the actuator 52b tilts the distal-end-side structure member 52 by the compressed air from the compressor. However, the actuator 52b may be an electric motor. When the distal-end-side structure member 52 is tilted to one side, one end of the distal-end-side structure member 52 is positioned near the other end of the proximal-end-side structure member 51, and the parts P sliding down the proximal-end-side structure member 51 are smoothly moved to the distal-end-side structure member 52 and slides down on the distal-end-side structure member 52. The distal-end-side structure member 52 has a stopper 52c that stops the sliding parts P at a predetermined position. On the contrary, when the distal-end-side structure member 52 is tilted to the other side, one end of the distal-end-side structure member 52 is separated from the proximal-end-side structure member 51.

Figure 5:
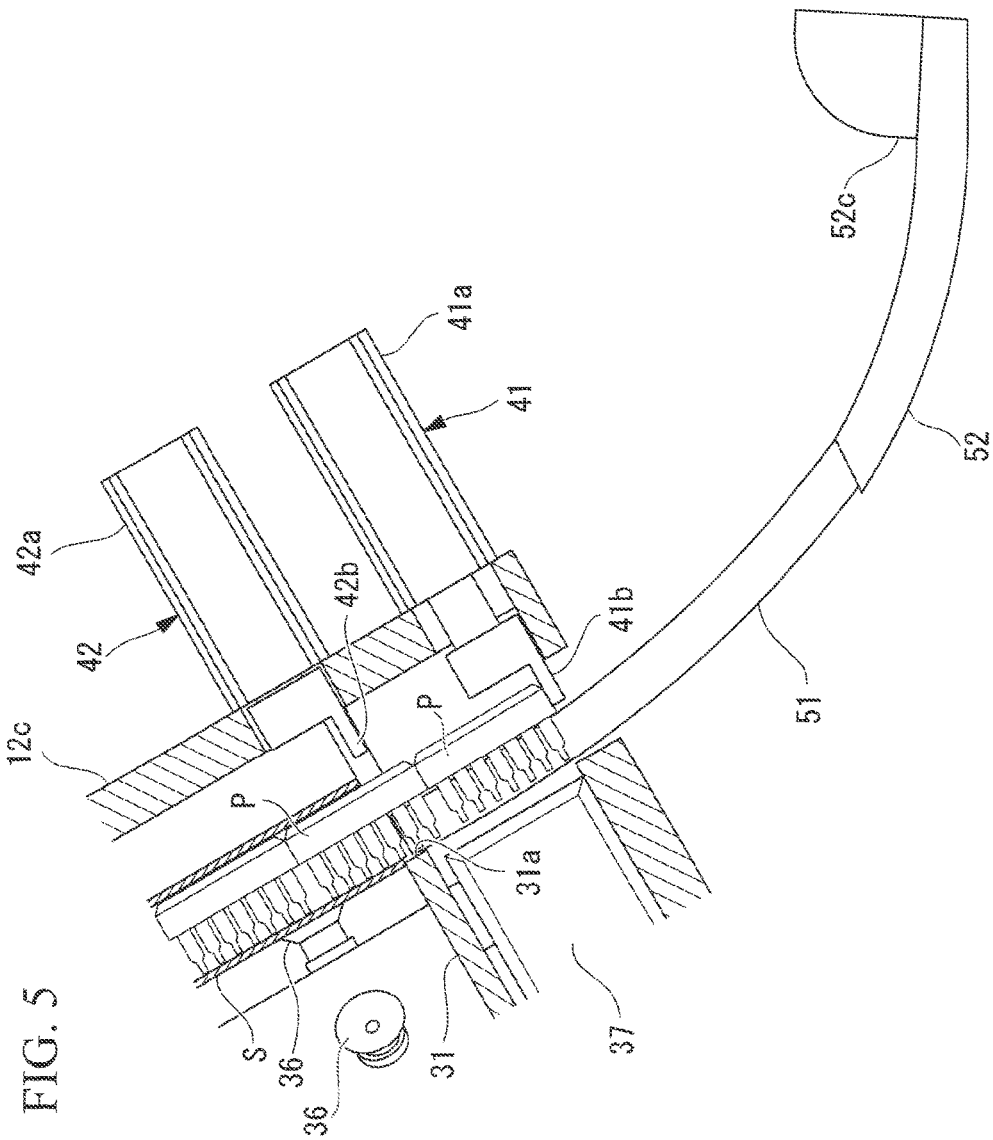
FIG. 5 is an explanatory operation diagram of the parts supply device of the present embodiment.
Figure 6:
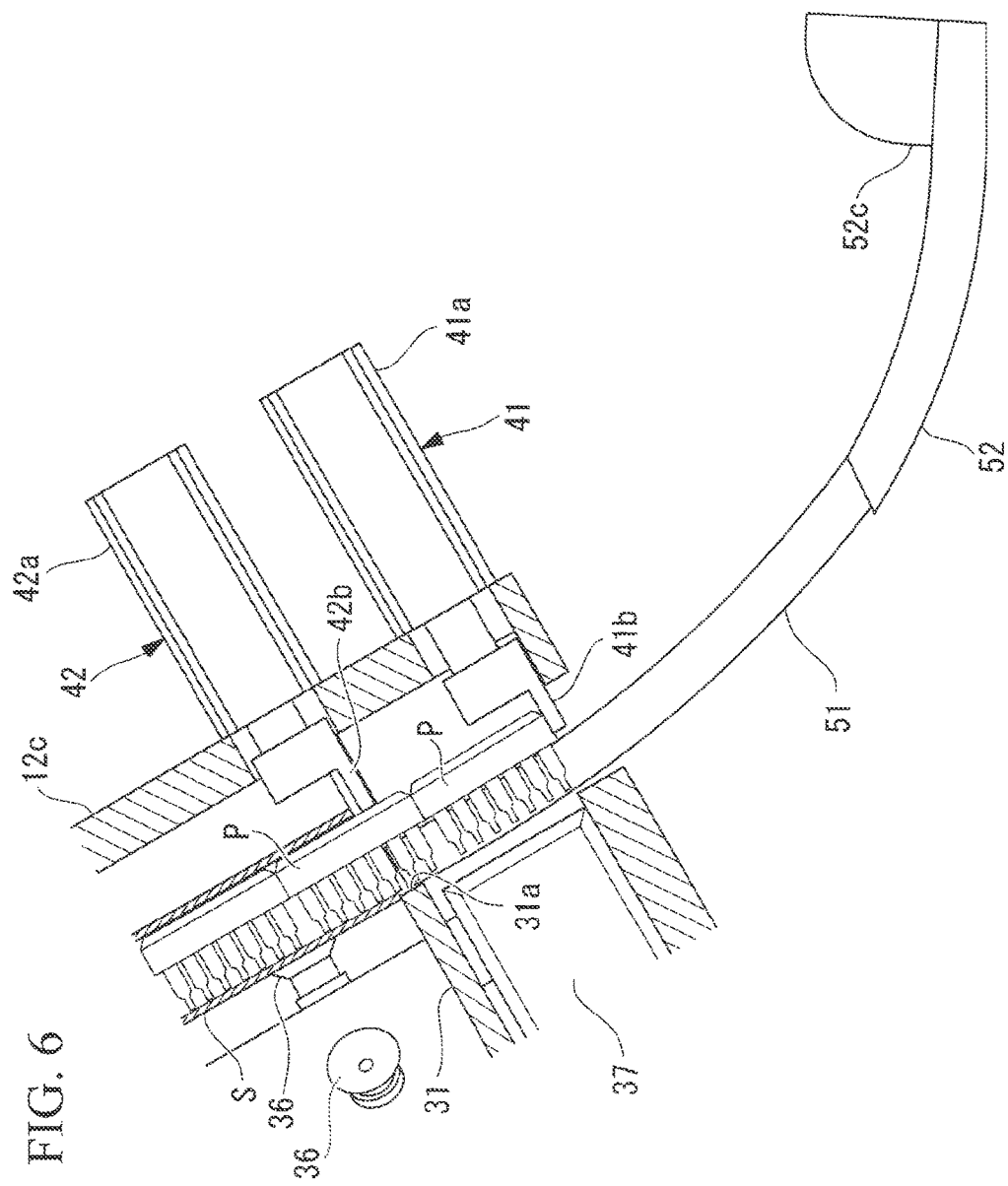
FIG. 6 is an explanatory operation diagram of the parts supply device of the present embodiment.
Figure 7:
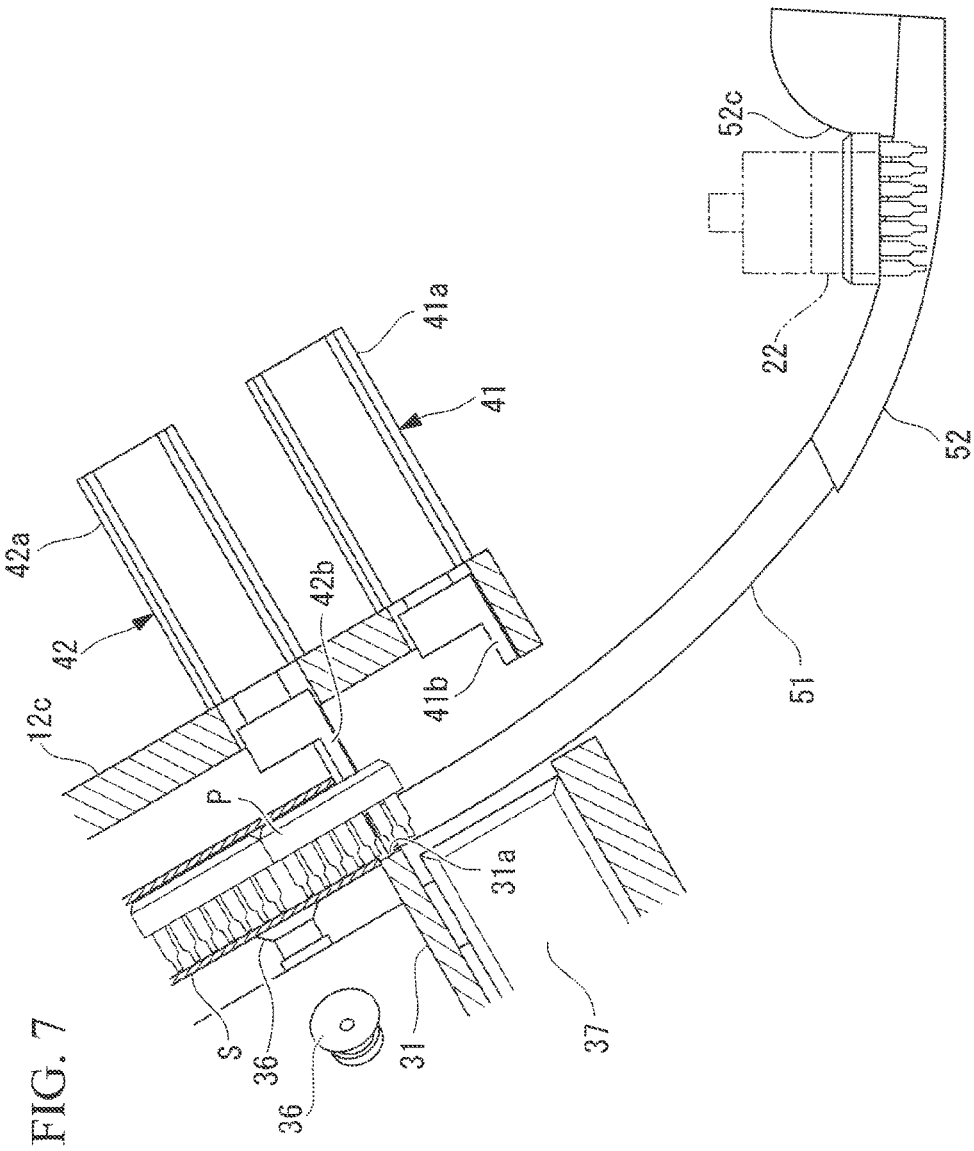
FIG. 7 is an explanatory operation diagram of the parts supply device of the present embodiment.

As illustrated in FIGS. 5 to 7, the parts discharging mechanism 40 has a first stopper mechanism 41 that stops the parts P on the guide member 50, and a second stopper mechanism 42 arranged upstream of the first stopper mechanism 41 in the sliding path of the parts P and stops the parts P, such that the parts P from the stick S slide down along the guide member 50 one by one.

The first stopper mechanism 41 includes a first actuator 41a fixed to the other-end side member 12c, and a first stopper 41b that is moved to approach the guide member 50 by the first actuator 41a. In the present embodiment, the first actuator 41a is connected to a compressor, and the first actuator 41a moves the first stopper 41b by the compressed air from the compressor. However, the first actuator 41a may be an electric motor.

The second stopper mechanism 42 includes a second actuator 42a fixed to the other-end side member 12c, and a second stopper 42b that protrudes into the through hole 31a by the second actuator 42a. In the present embodiment, the second actuator 42a is connected to a compressor, and the second actuator 42a moves the second stopper 42b by the compressed air from the compressor. However, the second actuator 42a may be one using an electric motor. The space between the first stopper 41b and the second stopper 42b is a space in which more than one but less than two of the parts P can be positioned. Further, the actuators 41a and 42a are controlled by the control unit 120 described below (see FIG. 4).

As illustrated in FIG. 5, the parts discharging mechanism 40 stops sliding down of the parts P by the first stopper mechanism 41 in a state where sliding down of the parts P is not stopped by the second stopper mechanism 42, and in that state, sliding down of the parts P is stopped by the second stopper mechanism 42, as illustrated in FIG. 6. Thereby, sliding down of the leading one of the parts P is stopped by the first stopper mechanism 41, and sliding down of the second-leading one of the parts P is stopped by the second stopper mechanism 42. In the present embodiment, the second stopper mechanism 42 presses the parts P against the guide member 50 provided inside the through hole 31a.

In this state, as illustrated in FIG. 7, when the first stopper 41b of the first stopper mechanism 41 is moved in a direction separating from the guide member 50, only the leading one of the parts P slides down along the guide member 50. Thereby, the parts P can be discharged one by one from the stick S. Next, after the first stopper 41b is moved in a direction approaching the guide member 50, the second stopper 42b is moved in a direction separating from the parts P. Thereby, the parts P in the stick S moves downward by the own weight to be in the state illustrated in FIG. 5, and the operation described above is repeated.

When the parts P are discharged one by one by the parts discharging mechanism 40, and the sensor of the parts presence/absence determination unit 38 detects that there is no parts P near the table member 31 in the stick S, the parts presence/absence determination unit 38 determines that parts P are not contained in the stick S.

Each of the parts P sliding down along the guide member 50 is stopped at the predetermined position (holding position) by the stopper 52c as illustrated in FIG. 7, and in this state, a part of the part P is positioned between the pair of claw members 22 of the parts holding tool 20. Therefore, when the pair of claw members 22 is moved in a closing direction by the parts holding tool 20, the part P at the predetermined position on the guide member 50 is held by the claw members 22.

The robot arm 110 has a plurality of movable parts, and also a plurality of servo motors 111 that move the movable parts respectively. The servo motors 111 are controlled by the control unit 120 described below (see FIG. 4). As the respective servo motors 111, various types of servo motors such as a rotary motor and a linier motor may be used.

Each of the servo motors 111 has an operating position detection device such as an encoder that detects the operating position thereof. Detection values of the operating position detection devices are transmitted to the control unit 120, and the detection values are used for control of the servo motors 111 by the control unit 120.

Figure 4:
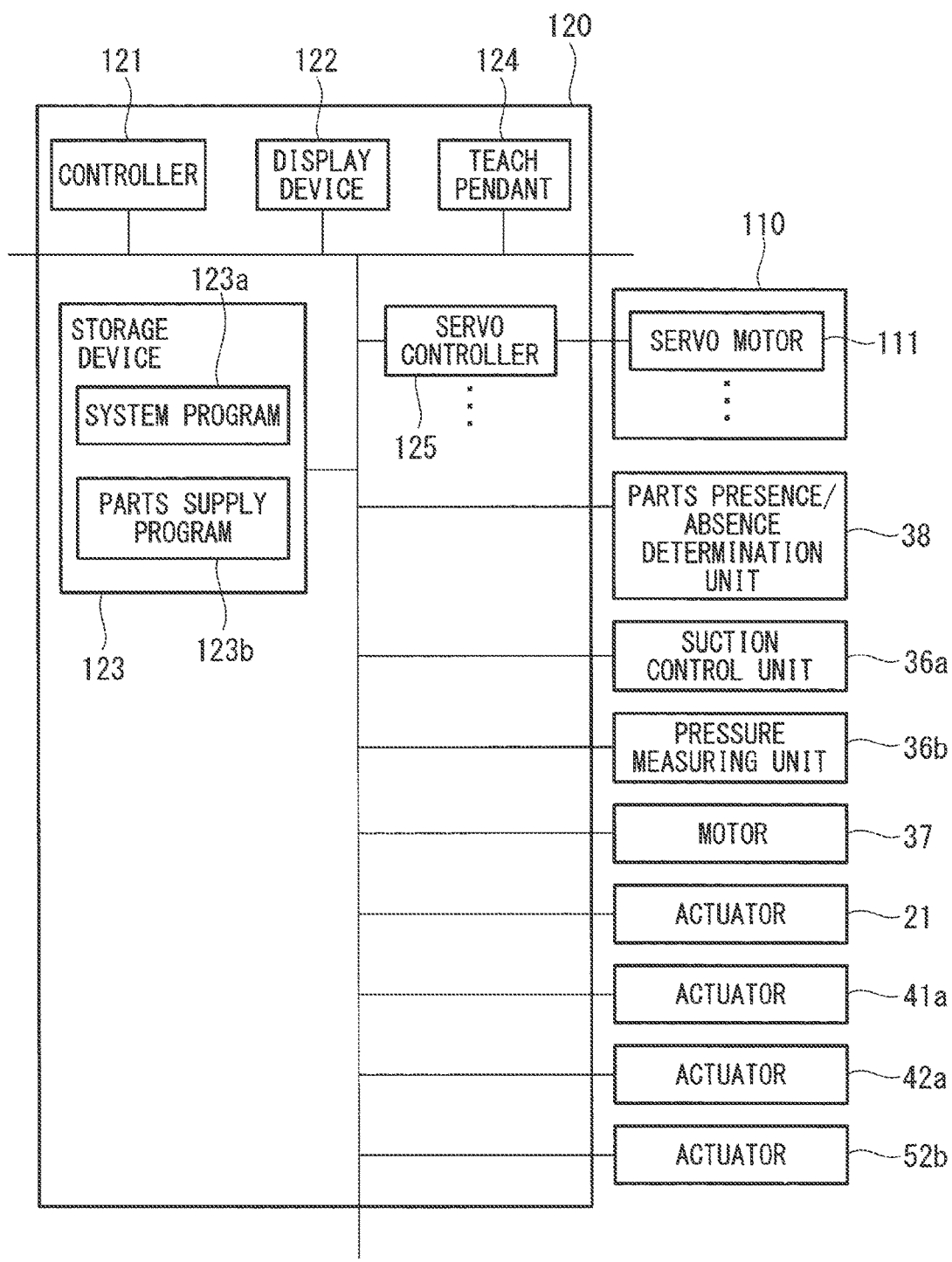
FIG. 4 is a block diagram of a control unit of the parts supply robot and the parts supply device of the present embodiment.

For example, the control unit 120 includes the controller 121 having a CPU, a RAM, and the like, a display device 122, storage device 123 including a nonvolatile memory, a ROM, and the like, a teach pendant 124 that is operated at the time of creating a operation program of the robot arm 110, and a plurality of servo controllers 125 provided to correspond to the respective servo motors 111 of the robot arm 110 (see FIG. 4).

In the storage device 123, a system program 123a is stored. The system program 123a provides a basic function of the control unit 120. Further, in the storage device 123, at least one parts supply program 123b created by using the teach pendant 124, for example, is stored.

For example, the control unit 121 operates by the system program 123a, reads the parts supply program 123b stored in the storage device 123 and temporarily stores it in the RAM, transmits control signals to the servo controllers 125 according to the readout parts supply program 123b, so as to control the servo amplifiers of the servo motors 111 to operate the robot arm 110, and also transmits control signals to the suction control unit 36a, the motor 37, and the actuators 21, 41a, 42a, 52b to control them.

Figure 8:
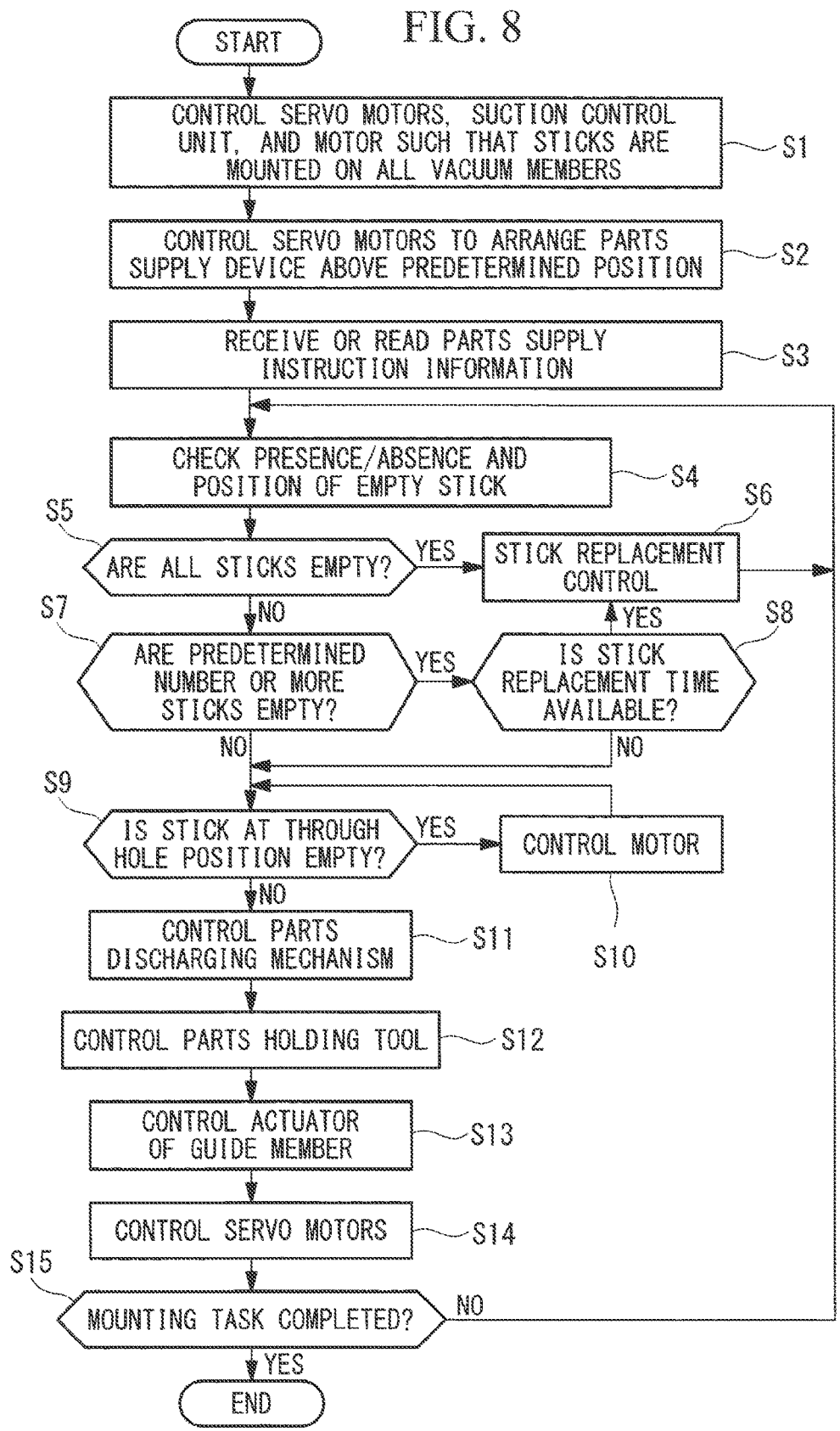
FIG. 8 is a flowchart illustrating an operation of a controller of the control unit of the present embodiment.

In the parts supply robot 100 configured as described above, an exemplary operation of the control unit 121 based on the parts supply program 123b will be described below with reference to FIG. 8.

First, the control unit 121 determines whether or not the sticks S are mounted on all of the vacuum members 36, based on the detection results of the pressure measuring unit 36b. If there is any vacuum member 36 on which the stick S is not mounted, the stick mounting unit 30 is positioned above the storage location of the sticks S containing the parts, and the control unit 121 controls the servo motors 111, the suction control unit 36a, and the motor 37 such that the stick S is sucked by the vacuum member 36 which is not sucking any stick S (step S1).

Figure 9:
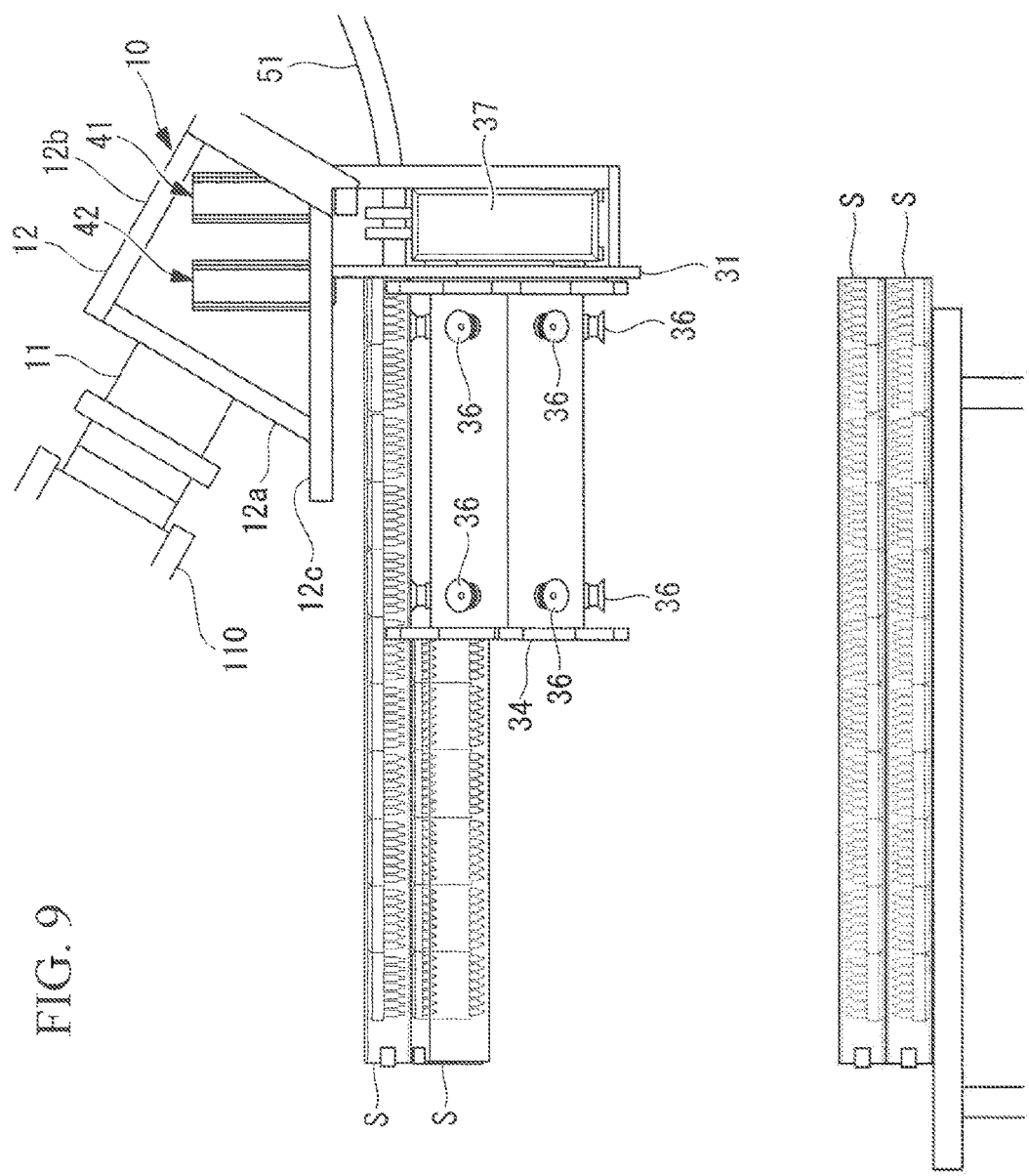
FIG. 9 is an explanatory operation diagram of the parts supply device of the present embodiment.

At this time, at the storage location, the sticks S are piled up in an overlapping manner in the short dimension direction, as illustrated in FIG. 9, for example. Further, as illustrated in FIG. 9, two vacuum members 36 for mounting are rotated to a rotation position for mounting by the motor 37, and the stick mounting unit 30 is moved and the posture thereof is changed such that the two vacuum members 36 are brought into contact with or approaches the outer circumferential face of the stick S to be mounted. In this state, the two vacuum members 36 suck the air.

When all of the vacuum members 36 are sucking the sticks S in step S1, the control unit 121 controls the servo motors 111 such that the parts supply device 1 is located above a predetermined position where the parts P are mounted or supplied (step S2).

Then, parts supply instruction information including information of the number of parts P to be mounted or supplied, mounting or supplying timing, mounting or supplying position, and the like is received or read (step S3), and the process described below is performed based on the parts supply instruction information. In the present embodiment, description will be given on the case where five pieces of the parts P, which are IC parts, are mounted on each of the circuit boards sequentially flowing by the conveyor.

First, the control unit 121 checks presence or absence of the stick S with no parts P and the position thereof, based on the detection results of the sensors of the parts presence/absence determination unit 38 (step S4), and determines whether or not there is any stick S with no parts P (step S5). If every stick S is empty, the control unit 121 performs stick change control (step S6).

When the determination is "NO" in step S5, the control unit 121 determines whether or not there are a predetermined number of empty sticks S although not every stick S is empty (step S7), and also determines whether or not it is possible to take a time for replacement of the sticks S, based on the information about the mounting timing (step S8). If it is possible to take a time for replacement, the control unit 121 performs stick replacement control (step S6).

In the stick replacement task in step S6, the stick mounting unit 30 is moved above the empty stick storage location, and the sucking by the vacuum member 36 of the empty stick S to be replaced is deactivated. After the stick S is dropped at the empty stick storage location, the stick mounting unit 30 is moved above the storage location of the sticks S containing the parts, and the vacuum member 36 is controlled to suck the stick S as described above. In the stick replacement control, there is a case of replacing all of the sticks S or replacing only one stick S.

Then, the control unit 121 determines whether or not the stick S at the position corresponding to the through hole 31a contains the parts P, based on the detection result of the sensor of the parts presence/absence determination unit 38 (step S9). When the stick S does not contain the parts P, the control unit 121 controls the motor 37 to rotate the rotor 32 to make another stick S containing the parts P to be arranged at the position corresponding to the through hole 31a (step S10).

Figure 10:
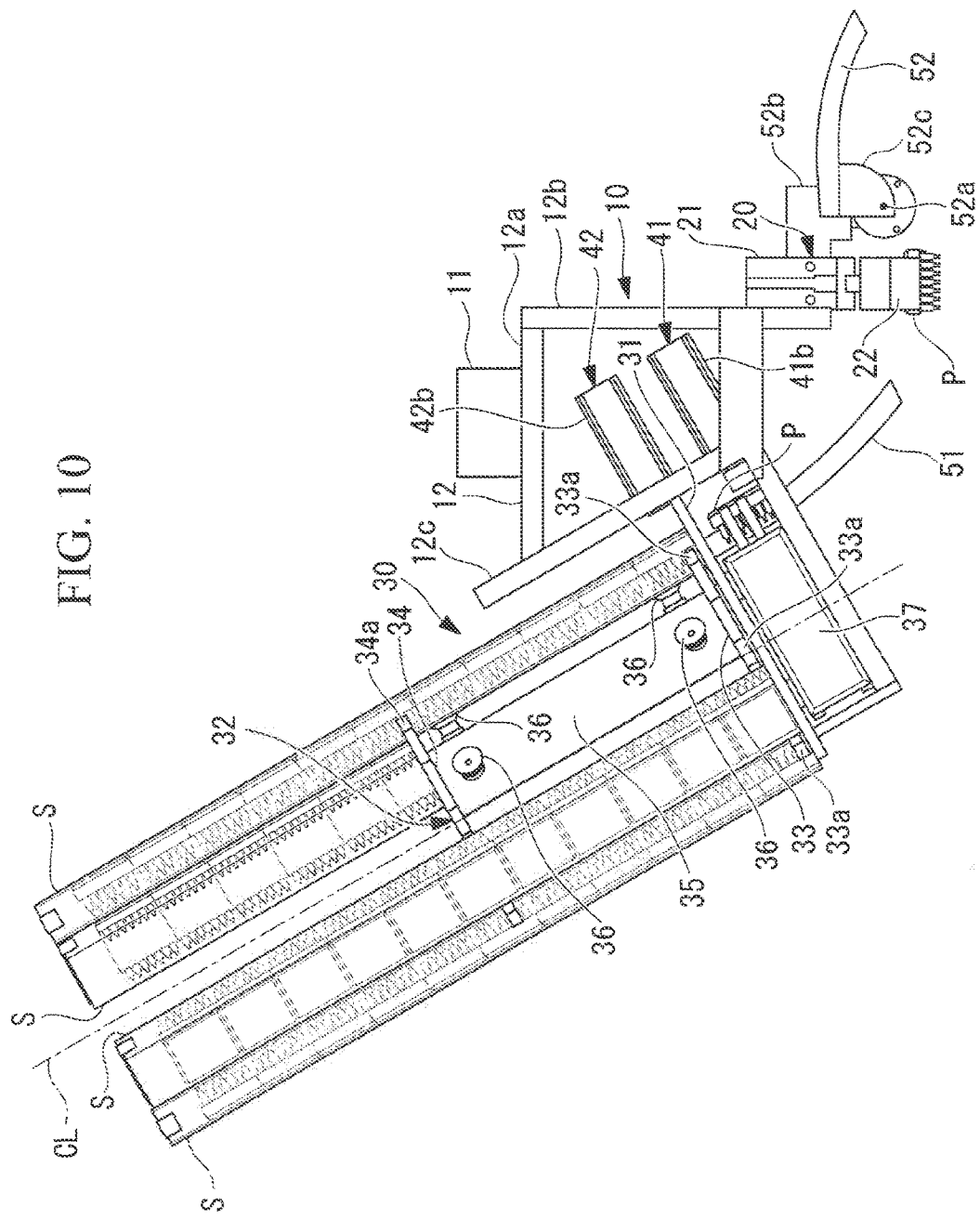
FIG. 10 is an explanatory operation diagram of the parts supply device of the present embodiment.

In the state where the determination is "NO" in step S9, the control unit 121 controls the actuators 41a and 42a of the parts discharging mechanism 40 to discharge one of the parts P (step S11), and controls the actuator 21 of the parts holding tool 20 such that the one of the parts P is held by the claw members 22 (step S12). The control unit 121 also controls the actuator 52b to tilt the distal-end-side structure member 52 in a direction away from the proximal-end-side structure member 51 (step S13). This causes a state where the guide member 50 is not present below the one of the parts P held by the parts holding tool 20 (see FIG. 10). This means that the actuator 52b functions as a relative movement device that allows the one of the parts held by the claw members 22 to be mountable on the circuit board.

Then, the control unit 121 controls the respective servo motors 111 such that the one of the parts P is mounted on the circuit board according to the parts supply instruction information (step S14). Then, the control unit 121 determines whether or not the mounting task based on the parts supply instruction information is completed (step S15), and if it is not completed, performs the control again from step S4.

In this way, according to the present embodiment, the parts holding tool 20 and the stick mounting unit 30 are supported at the distal end portion of the robot arm 110 via the robot attachment member 10, and the parts P in the stick S, mounted on the stick mounting unit 30, are discharged one by one by the parts discharging mechanism 40. The discharged parts P are guided, by the guide member 50, to a position where each of the parts P can be held by the pair of claw members 22 of the parts holding tool 20. Then, in a state where one of the parts P is held by the pair of claw members 22, at least one of the guide member 50 and the pair of claw members 22 is moved, whereby the one of the parts held by the pair of claw members 22 can be mounted on or supplied to a predetermined position by using the robot arm 110.

Further, the stick mounting unit 30 has the vacuum members 36 by which the stick S is mounted through suction of the air. Accordingly, the stick S can be removed from the stick mounting unit 30 when suction of the air by the vacuum member 36 is stopped, and the stick S can be mounted on the stick mounting unit 30 when the air is sucked by the vacuum member 36. Therefore, it is possible to mount and remove the stick S easily, whereby the degree of freedom regarding the place for the stick S before mounting and after removal and design of the device and the like is enhanced.

Further, the stick mounting unit 30 includes the table member 31 having the through hole 31a, the rotor 32 rotatable about the rotation axis CL perpendicular to the upper surface of the table member 31, and the motor 37 that rotates the rotor 32. On the rotor 32, the stick S is mounted such that one end in the longitudinal direction of the stick S is brought into contact with or approaches the upper surface of the table member 31. Accordingly, the parts P contained in the stick S mounted on the stick mounting unit 30 and located at a position other than the through hole 31a do not come out from the stick S by the upper surface of the table member 31.

Further, on the rotor 32, a plurality of sticks S are mounted to be aligned around the rotation axis CL. Accordingly, by rotating the rotor 32 by the motor 37, any stick S can be arranged at the position of the through hole 31a. Therefore, when the stick S arranged at the position of the through hole 31a is empty, another stick S containing the parts P can be arranged at the position of the through hole 31a reliably in a short time.

Further, the guide member 50 includes a plurality of structure members 51 and 52, and the actuator 52b moves the distal-end-side structure member 52 with respect to the proximal-end-side structure member 51. This provides a state where one of the parts P held by the pair of claw members 22 can be mounted on or supplied to a predetermined position with use of the robot arm 110. As described above, as it is not necessary to move the claw members 22 with respect to the robot arm 110, it is advantageous in realizing easy motion teaching of the robot arm 110 for mounting or supplying the parts P.

Further, the parts discharging mechanism 40 includes the first stopper 41b, the first actuator 41a that restricts movement, to the holding position side, of the leading one of the parts P discharged from the stick S and aligned in a line by moving the first stopper 41b, the second stopper 42b provided at a position farther from the holding position than the first stopper 41b, and the second actuator 42a that restricts movement, to the holding position side, of the second-leading one of the parts P by moving the second stopper 42b. Therefore, by controlling the first and the second actuators 41a and 42a, the parts P can be discharged one by one.

In the present embodiment, the rail-shaped guide member 50 is shown. However, the guide member 50 may be in a gutter shape, or the guide member 50 may have another aspect in which the parts P slide down along it. Further, the parts P may be ones other than IC parts if they slide down along the guide member 50.

Further, each of the vacuum members 36 may be configured of an electromagnet, and each of the vacuum members 36 may attract the stick S with the magnetic force. In that case, an iron attracted member is fixed at an attracted position of the stick S. Further, instead of the respective vacuum members 36, a holding mechanism for holding the stick S may be provided. It is also possible to provide another mechanism for holding the stick S.

Further, the stick mounting unit 30 may be configured such that the stick S can be mounted one by one.

The present embodiment describes an example in which a part of the guide member 50 is retracted with respect to the claw members 22 by the actuator 52b. Meanwhile, it is acceptable to move the claw members 22 with respect to the guide member 50, so as to allow one of the parts P held by the claw members 22 to be in a state of being mountable on or being able to be supplied to a predetermined position by the robot arm 110.

For example, by using a moving mechanism for moving the actuator 21 of the parts holding tool 20 upward with respect to the one-end side member 12b, and a rotating mechanism for rotating the actuator 21 about the axis perpendicular to the one-end side member 12b, when moving the claw members 22 with respect to the guide member 50, it is possible to mount or supply one of the parts P held by the claw members 22 on or to a predetermined position by the robot arm 110.

Further, instead of tilting the distal-end-side structure member 52 of the guide member 50 about the tilt axis 52a, by moving the distal-end-side structure member 52 in the longitudinal direction thereof or moving the distal-end-side structure member 52 in another direction, it is possible to allow one of the parts P held by the claw members 22 to be in a state of being mountable on or being able to be supplied to a predetermined position by the robot arm 110. Moreover, by moving the guide member 50 as a whole, it is also possible to allow one of the parts P held by the claw members 22 to be in a state of being mountable on or being able to be supplied to a predetermined position by the robot arm 110.

Figure 11:
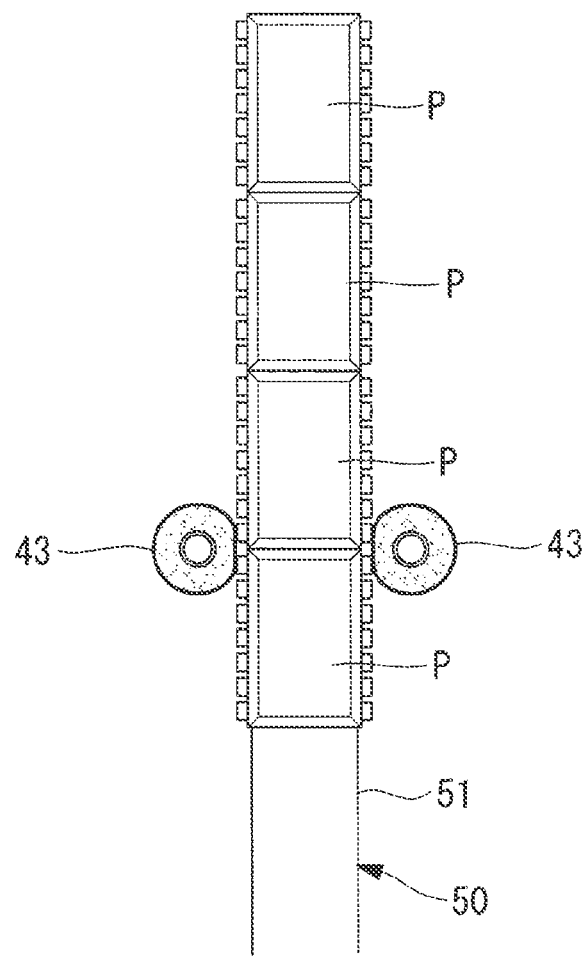
FIG. 11 is a side view of a main part of a parts supply device illustrating a modification of a parts discharging mechanism of the present embodiment.

Further, it is only necessary that the parts discharging mechanism 40 allows the parts P to reach the holding position of the guide member 50 one by one. For example, as illustrated in FIG. 11, it is possible to hold the leading and the second-leading parts P on the guide member 50 simultaneously by a pair of soft rollers 43 having rubbery elasticity, and rotate one or both of the rollers 43 by a driving device not illustrated, so as to discharge the parts P one by one.

The inventor has arrived at the following aspects of the present invention.

A parts supply device according to a first aspect of the present invention includes a robot attachment member configured to be attached to a distal end portion of a robot arm; a parts holding tool supported by the robot attachment member and having a holding member for holding parts; a stick mounting unit which is supported by the robot attachment member and on which at least one tubular stick containing the parts aligned in a direction is mountable; a parts discharging mechanism which discharges, one by one, the parts contained in the stick mounted on the stick mounting unit; a guide member that guides the parts discharged by the parts discharging mechanism to a holding position at which one of the parts can be held by the holding member; and a relative movement device which moves at least one of the guide member and the holding member in a state in which the one of the parts guided to the holding position is held by the holding member in order to allow the one of the parts held by the holding member to be in a state in which the one of the parts can be mounted on or supplied to a predetermined position.

In this aspect, the parts holding tool and the stick mounting unit are supported via the robot attachment member at a distal end portion of the robot arm, and the parts contained in the stick mounted on the stick mounting unit are discharged one by one by the parts discharging mechanism. The discharged parts are guided by the guide member to the holding position where the parts can be held by the holding member of the parts holding tool. Then, in the state where one of the parts is held by the holding member, by moving at least one of the guide member and the holding member, it is possible to mount or supply the one of the parts held by the holding member on or to a predetermined position, using the robot arm.

In the aforementioned aspect, it is preferable that the stick mounting unit includes a vacuum member on which the stick is mounted through suction of air.

In that case, the stick can be removed from the stick mounting unit when suction of the air by the vacuum member is stopped, and the stick can be mounted on the stick mounting unit when the air is sucked by the vacuum member. Therefore, it is possible to mount and remove the stick easily, whereby the degree of freedom regarding the place for the stick before mounting and after removal and design of the device and the like is enhanced.

In the aforementioned aspect, it is preferable that the stick mounting unit includes: a table member fixed to the robot attachment member and having at least one through hole through which the parts pass; a rotor rotatable about a rotation axis perpendicular to an upper surface of the table member; and a driving device that rotates the rotor, wherein the rotor is one to which a plurality of the sticks are mounted so that one ends of the sticks are brought into contact with or adjacent to the upper surface of the table member and that the sticks are aligned around the rotation axis, and wherein the parts contained in the stick located at a position corresponding to the through hole by rotation of the rotor by the driving device is guided to the holding position through the through hole and the guide member.

In that case, on the rotor, the stick is mounted such that one end in the longitudinal direction of the stick is brought into contact with or approaches the upper surface of the table member. Accordingly, the parts contained in the stick mounted on the stick mounting unit and located at a position other than the through hole do not come out from the stick by the upper surface of the table member.

Further, on the rotor, a plurality of sticks are mounted to be aligned around the rotation axis. Accordingly, by rotating the rotor by the driving device, a selected stick can be arranged at the position of the through hole. Therefore, when the stick arranged at the position of the through hole is empty, another stick containing parts can be arranged at the position of the through hole reliably in a short time.

In the aforementioned aspect, it is preferable that the guide member includes a plurality of structure members aligned in a longitudinal direction of the guide member, and the guide member is configured such that the parts slide down along the structure members to the holding position, and the relative movement device is configured to move at least one of the structure members corresponding to the holding position relative to a residual of the structure members to allow the one of the parts held by the holding member to be in the state in which the one of the parts can be mounted on or supplied to the predetermined position.

In that case, as it is not necessary to move the holding member with respect to the robot arm, it is advantageous in realizing easy motion teaching of the robot arm for mounting or supplying the parts.

In the aforementioned aspect, it is preferable that the parts discharging mechanism includes: a first stopper; a first actuator that moves the first stopper to restrict movement of a first one of the parts discharged from the stick and aligned in a direction, the movement being toward the holding position; a second stopper provided at a position distant from the holding position relative to the first stopper; and a second actuator that moves the second stopper to restrict movement of a second one of the parts toward the holding position. In that case, by controlling the first and the second actuators, it is possible to discharge the parts one by one.

A parts supply robot, according to a second aspect of the present invention, includes a robot arm, and the parts supply device attached to a distal end portion of the robot arm.

According to the aforementioned aspects, it is possible to efficiently mount or supply parts, which is aligned in a tubular stick containing parts, on or to a predetermined position without using another robot.

The invention claimed is:

1. A parts supply device comprising:
a robot attachment member configured to be attached to a distal end portion of a robot arm;
a pair of claws which are supported by the robot attachment member and which are moved toward and away from each other by a first actuator;
a vacuum member which is supported by the robot attachment member and which is connected to a compressor via a pipe so that a tubular stick containing parts aligned in a direction is mounted on the vacuum member when the compressor sucks air;
a guide slider that receives the parts from the stick mounted on the vacuum member and guides the parts to a holding position at which one of the parts can be held by the pair of claws; and
a second actuator which moves the guide slider from a first position, in which the one of the parts is guided to the holding position by the guide slider, to a second position in which the guide slider is apart from the one of the parts which is held by the pair of claws so that the one of the parts held by the pair of claws can be mounted on or supplied to a predetermined position.

2. The parts supply device according to claim 1, wherein the guide slider includes a plurality of structure members aligned in a longitudinal direction so that the parts slide down along the plurality of structure members to the holding position, and
the second actuator is configured to move at least one of the plurality of structure members corresponding to the holding position relative to another of the plurality of structure members.

3. The parts supply device according to claim 1, wherein the guide slider includes:
a first stopper;
a third actuator that moves the first stopper to restrict movement of a first one of the parts discharged from the stick toward the holding position;
a second stopper provided at a position distant from the holding position relative to the first stopper; and
a fourth actuator that moves the second stopper to restrict movement of a second one of the parts toward the holding position.

4. A parts supply robot comprising:
a robot arm; and
the parts supply device according to claim 1, attached to a distal end portion of the robot arm.

5. A parts supply device comprising:
a robot attachment member configured to be attached to a distal end portion of a robot arm;
a pair of claws which are supported by the robot attachment member and which are moved toward and away from each other by a first actuator;
a vacuum member which is supported by the robot attachment member and which is connected to a compressor via a pipe so that a tubular stick containing parts aligned in a direction is mounted on the vacuum member when the compressor sucks air;
a guide slider that receives the parts from the stick mounted on the vacuum member and guides the parts to a holding position at which one of the parts can be held by the pair of claws; and
a second actuator which moves the guide slider from a first position, in which the one of the parts is guided to the holding position by the guide slider, to a second position in which the guide slider is apart from the one of the parts which is held by the pair of claws so that the one of the parts held by the pair of claws can be mounted on or supplied to a predetermined position,
wherein the parts supply device further includes:
a table member fixed to the robot attachment member and having at least one through hole through which the parts pass;
a rotor rotatable about a rotation axis perpendicular to an upper surface of the table member; and
a driving device that rotates the rotor,
wherein the rotor has a plurality of the vacuum members to which a plurality of the sticks are mounted so that one ends of the sticks are brought into contact with or adjacent to the upper surface of the table member and that the sticks are aligned around the rotation axis, and
wherein the parts contained in the stick located at a position corresponding to the through hole by rotation of the rotor by the driving device is guided to the holding position through the through hole and the guide slider.

6. A parts supply device, comprising:
a robot attachment member adapted to attach to a distal end portion of a robot arm;
a pair of claws disposed on the robot attachment member;
a first actuator connected to the pair of claws to move the pair of claws toward and away from each other;
a vacuum member supported on the robot attachment member and being connected to a compressor via a pipe to apply a vacuum;
at least one stick removably supported on the vacuum member when the vacuum is applied to the vacuum member, wherein the at least one stick is adapted to contain a plurality of parts;
a guide slider that receives at least one of the plurality of parts from the stick and guides the at least one of the plurality of parts to a holding position thereon, the holding position providing a location for the pair of claws to pick up the at least one of the plurality of parts therefrom; and
a second actuator that moves the guide slider from a first position where the at least one of the plurality of parts is received at the holding position and a second position where the at least one of the plurality of parts is picked up by the pair of claws.

7. The parts supply device according to claim 6, wherein:
the guide slider includes at least a first structural member and a second structural member,
wherein the second structural member is movable relative to the first structural member by the second actuator.

8. The parts supply device according to claim 6, wherein the guide slider further comprises: a first stopper; a third actuator that moves the first stopper to restrict movement of a first one of the plurality of parts toward the holding position; a second stopper provided at a position upstream from the first stopper; and a fourth actuator that moves the second stopper to restrict movement of a second one of the plurality of parts toward the holding position.

9. A parts supply robot comprising:
a robot arm; and
the parts supply device according to claim 6, attached to a distal end portion of the robot arm.

* * * * *